US009318410B2

(12) United States Patent  
De Cecco et al.

(10) Patent No.: US 9,318,410 B2  
(45) Date of Patent: Apr. 19, 2016

(54) COOLING ASSEMBLY USING HEATSPREADER

(71) Applicant: ALCATEL LUCENT CANADA, INC., Ottawa (CA)

(72) Inventors: Stefano F. De Cecco, Ottawa (CA); Gregory W. Cheshire, Woodlawn (CA)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/037,706

(22) Filed: Sep. 26, 2013

(65) Prior Publication Data

US 2015/0084182 A1 Mar. 26, 2015

(51) Int. Cl.
*H01L 23/36* (2006.01)
*H01L 21/48* (2006.01)
*H01L 23/42* (2006.01)
*H01L 23/40* (2006.01)

(52) U.S. Cl.
CPC ............ *H01L 23/36* (2013.01); *H01L 23/4093* (2013.01); *H01L 23/42* (2013.01); *H01L 2924/0002* (2013.01)

(58) Field of Classification Search
CPC ..... H01L 23/36; H01L 23/42; H01L 23/4093; H01L 21/48; H01L 2924/0002; H01L 2924/00
USPC ......... 257/720, 675, 676, 704, 705, 708, 712, 257/714, 717, 692; 361/701; 438/122
See application file for complete search history.

(56) References Cited

U.S. PATENT DOCUMENTS

| | | | |
|---|---|---|---|
| 4,831,980 A * | 5/1989 | Nasu et al. ............... | 123/196 A |
| 5,074,568 A * | 12/1991 | Bertsch .................... | 277/318 |
| 6,523,608 B1 * | 2/2003 | Solbrekken et al. .......... | 165/185 |
| 6,665,188 B1 * | 12/2003 | Chen ........................ | 361/719 |
| 6,789,312 B2 * | 9/2004 | White ....................... | 29/832 |
| 7,218,525 B2 * | 5/2007 | Lo et al. ................... | 361/719 |
| 7,495,922 B2 * | 2/2009 | Ploeg et al. ............... | 361/719 |
| 2003/0051868 A1 * | 3/2003 | Dishongh et al. .......... | 165/185 |
| 2004/0130876 A1 * | 7/2004 | Davison .................... | 361/719 |
| 2005/0073042 A1 * | 4/2005 | Hirano et al. ............. | 257/717 |
| 2007/0097653 A1 * | 5/2007 | Gilliland et al. ........... | 361/719 |
| 2008/0067669 A1 * | 3/2008 | Buttel ....................... | 257/706 |
| 2008/0068805 A1 * | 3/2008 | Xu et al. .................... | 361/710 |
| 2008/0079129 A1 * | 4/2008 | Ganapathysubramanian et al. ........................ | 257/678 |
| 2008/0142195 A1 * | 6/2008 | Erturk et al. ............... | 165/94 |
| 2008/0261350 A1 * | 10/2008 | Daves et al. ................ | 438/106 |
| 2011/0044004 A1 * | 2/2011 | Garosshen et al. .......... | 361/709 |
| 2012/0092826 A1 * | 4/2012 | Heidepriem et al. ..... | 361/679.54 |
| 2012/0236500 A1 * | 9/2012 | Higuchi et al. ............ | 361/699 |
| 2012/0285673 A1 * | 11/2012 | Cola et al. ................. | 165/185 |
| 2013/0199770 A1 * | 8/2013 | Cherian ..................... | 165/185 |
| 2013/0314877 A1 * | 11/2013 | Watanabe et al. .......... | 361/719 |
| 2014/0085824 A1 * | 3/2014 | Wavering ................... | 361/701 |
| 2014/0151872 A1 * | 6/2014 | Ogawa et al. .............. | 257/719 |

(Continued)

*Primary Examiner* — Alexander Oscar Williams  
(74) *Attorney, Agent, or Firm* — Kramer & Amado, P.C.

(57) ABSTRACT

Various embodiments relate to a microchip die cooling assembly comprising a circuit board; a microchip having an exposed die attached to the circuit board; a heatspreader having a top side and a bottom side; a heat sink having a bottom side and a top side comprising a cooling structure; a first thermal interface material in contact with the exposed die and the bottom side of the heatspreader; and a second thermal interface material in contact with the top side of the heat spreader and the bottom side of the heat sink.

10 Claims, 3 Drawing Sheets

(56) References Cited

U.S. PATENT DOCUMENTS

| | | | |
|---|---|---|---|
| 2014/0158326 A1* | 6/2014 | Lyon | 165/104.31 |
| 2014/0264818 A1* | 9/2014 | Lowe et al. | 257/712 |
| 2014/0321942 A1* | 10/2014 | Aukzemas et al. | 411/353 |
| 2014/0374898 A1* | 12/2014 | Komatsu | 257/719 |

* cited by examiner

COOLING ASSEMBLY USING HEATSPREADER

TECHNICAL FIELD

Various exemplary embodiments disclosed herein relate generally to microchip cooling.

BACKGROUND

As power consumption of electronic components increases, proper cooling measures must be taken to ensure consistent operation. Over time, traditional electronic cooling assemblies have had to adapt to increasing demands. The existing specialized solutions for this problem, such as vapor chambers and heat pipes, typically are expensive to design, manufacture, and assemble. Thus, there is a need to develop a passive cooling solution to prevent overheating in electronic components that is less expensive and at least equally functional.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a microchip die cooling assembly comprising a circuit board; a microchip having an exposed die attached to the circuit board; a heatspreader having a top side and a bottom side; a heat sink having a bottom side and a top side comprising a cooling structure; a first thermal interface material in contact with the exposed die and the bottom side of the heatspreader; and a second thermal interface material in contact with the top side of the heat spreader and the bottom side of the heat sink.

Further, various exemplary embodiments relate to a method of assembling a die cooling device, comprising the steps of: attaching a chip having an exposed die to a circuit board; applying a first thermal interface material to the die; attaching a heatspreader to the die via the first thermal interface material; applying a second thermal interface material to the heatspreader; and attaching a heat sink to the heatspreader via the second thermal interface material.

Further, various exemplary embodiments relate to wherein the assembly further comprises two pins having barbs securing the heatspreader to the circuit board and a spring attached to each pin that biases the heatspreader against the chip die; wherein the heat sink is made of copper, zinc, aluminum, or a zamak alloy; wherein the heat sink forms an outer wall of an enclosure which holds the circuit board; wherein the heatspreader is made of copper or aluminum; wherein the first thermal interface material is thermal grease or a phase change material; wherein the second thermal interface material is a gap pad or thermal gel; wherein the assembly is a passive cooling system.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Figure 1:
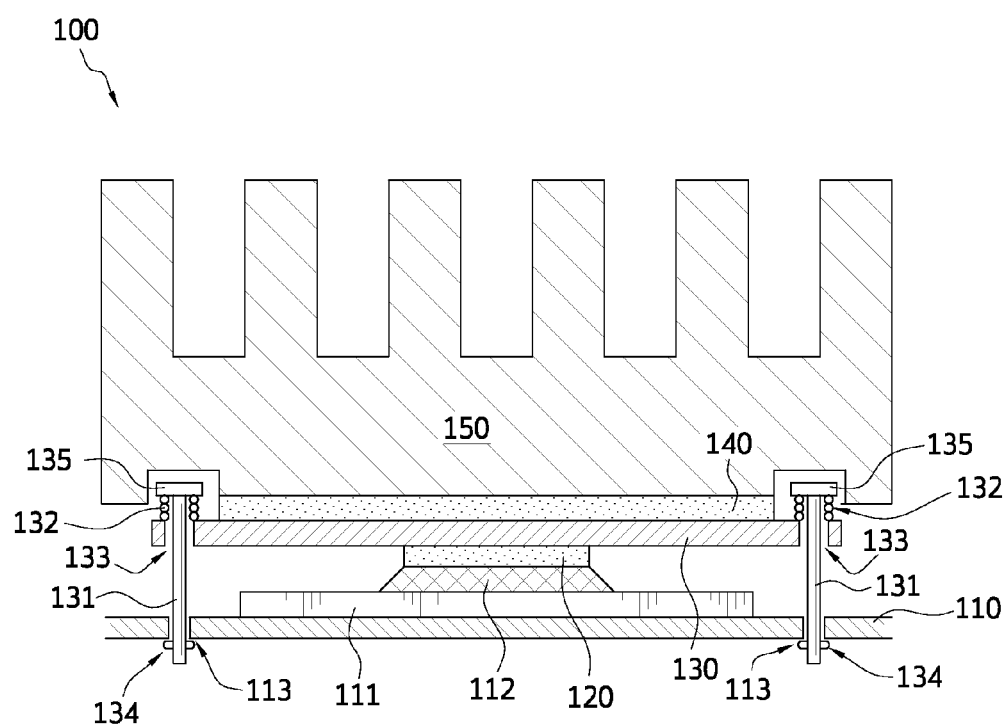
FIG. 1 illustrates a cross-sectional view of an embodiment of a microchip cooling assembly using a heatspreader.

FIG. 1 illustrates a cross-sectional view of an embodiment of a microchip cooling assembly using a heatspreader. Chip die cooling assembly 100 includes microchip 111 mounted on circuit board 110 and having exposed chip die 112. Exposed chip die 112 creates a concentrated cooling area for microchip 111 because the die itself is uncovered without any internal methods to distribute the heat generated during operation. This allows for more efficient cooling of microchip 111, but because the heat source is concentrated, it can create localized hot spots if cooled only by a large heat sink. In an exemplary embodiment, microchip 111 is a flip chip.

In order to more evenly distribute the concentrated heat generated by exposed chip die 112, heatspreader 130 is attached to exposed chip die 112. First thermal interface material (TIM) 120 is applied to exposed chip die 112 prior to attaching heatspreader 130 in order to allow for more efficient heat transfer by filling in air gaps between exposed die 112 and heatspreader 130. In an exemplary embodiment, first TIM 120 may be a thermal grease or a phase change material.

Heatspreader 130 is secured to exposed die 112 using two or more pins 131. Pins 131 each respectively have pin heads 135 and pin securing nubs 134. Pins 131 are threaded through springs 132 and heatspreader holes 133 prior to being secured in circuit board mounting holes 113. Springs 132 bias heatspreader 130 against exposed chip die 112. Pin securing nubs 134 prevent pins 131 from slipping through circuit board mounting holes 113. In an exemplary embodiment, springs 132 are helical springs. However additional spring designs may be used that provide the necessary biasing force. Springs 132 are shown as being located between pin heads 135 and heatspreader holes 133, however springs 132 may alternatively be placed on the bottom side of circuit board 110, pushing against pin securing nubs 134. Also, in an exemplary embodiment, pins 131 may be made of brass. However, other materials may be used. Further methods and devices may be used to secure heatspreader 130.

Heat sink 150 is attached to heatspreader 130 by way of second TIM 140. Second TIM 140 may be a thermally conductive gel or a gap filler material. Heat sink 150 acts as the primary heat sink for chip die cooling assembly 100, having a cooling structure. In an exemplary embodiment, as shown in FIG. 1, the cooling structure is implemented as passive cooling fins. However, alternative embodiments include a fan across the fins, or heat sink 150 acting as a liquid cooled block, using chilled water or other coolant fluids. In an exemplary embodiment, heat sink 150 is a solid piece of cast aluminum. However, heat sink 150 may alternatively be machined or cast using other thermally conductive metals, including copper, zinc, or zamak. In an exemplary embodiment, heat sink 150 forms the outer wall of an enclosure, which houses circuit board 110. However, heat sink 150 may also act as an internal passive heat sink inside an enclosure.

Figure 2:
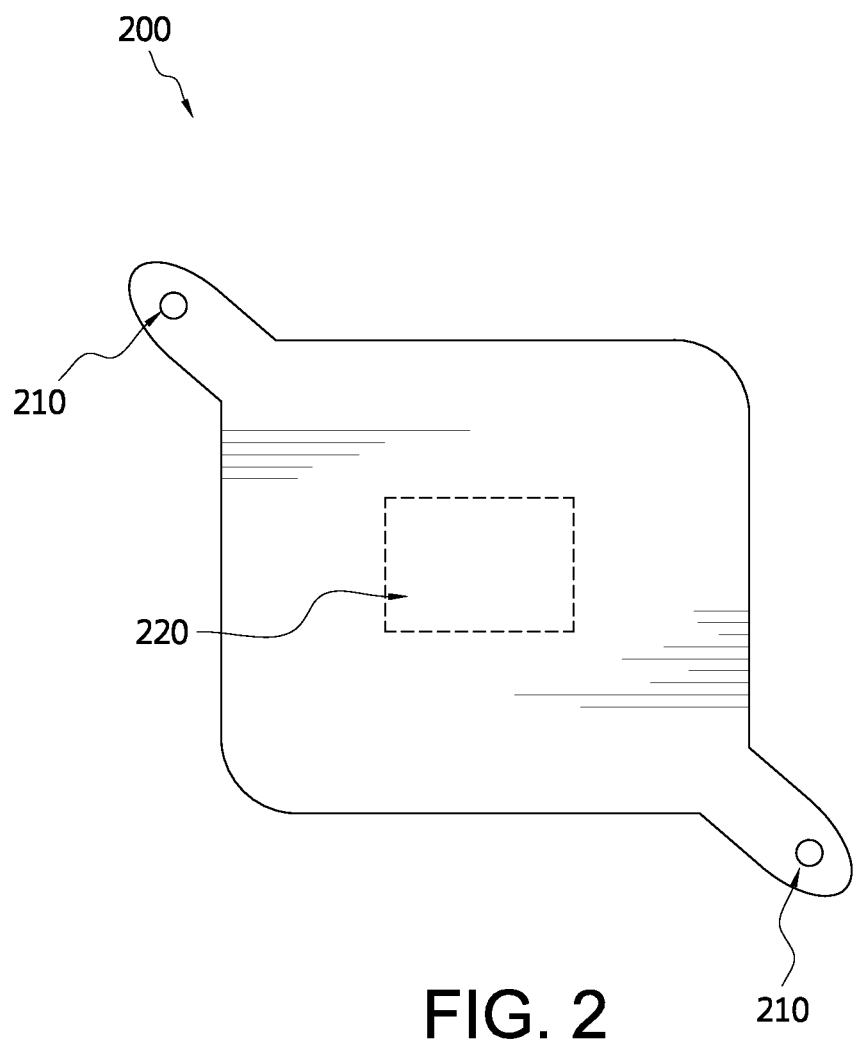
FIG. 2 illustrates a view of an isolated heatspreader.

FIG. 2 illustrates a view of an isolated heatspreader. An exemplary embodiment of heatspreader 200 is depicted having chip die contact area 220 and two heatspreader mounting holes 210 placed on arms extending from opposite corners of the heatspreader body.

The area of heatspreader 200 is significantly larger than the area of the exposed chip die, identified by chip die contact area 220. For example, in some embodiments, the area of heatspreader 200 is at least twice as large as chip die contact area 220. This allows the concentrated heat from the chip die to be distributed throughout the body of heatspreader 200 in order to prevent hotspots from forming on a larger heat sink from the concentrated heat source.

In alternative embodiments, the location and number of mounting holes for heatspreader 200 may vary. For example, an alternative embodiment may use four heatspreader mounting holes extending from each side. Another alternative embodiment would have three heatspreader mounting holes extending from a combination of corners and sides. Other alternatives are known and appreciated, and the embodiments described above are in no way meant to limit the number and location of heatspreader mounting holes 210. Further, the shape of heatspreader 200 may be any shape such that it provides the requisite surface area and fits in the area available in the assembly.

In an exemplary embodiment, heatspreader 200 is made of a flat aluminum plate, smooth on its top face and bottom face. In an alternative embodiment, heatspreader 200 is made of another conductive metal, such as copper.

Figure 3:
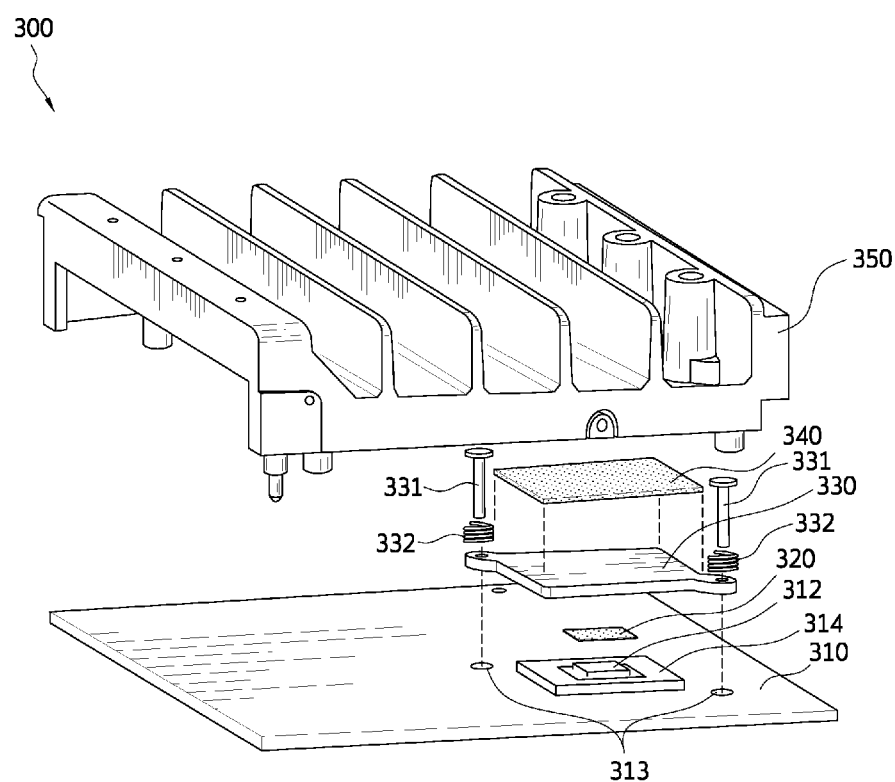
FIG. 3 illustrates an exploded isometric view of an embodiment of a microchip cooling assembly using a heatspreader.

FIG. 3 illustrates an exploded isometric view of an embodiment of a microchip cooling assembly using a heatspreader. Chip die cooling assembly 300 of FIG. 3 is a different view of the chip die cooling assembly 100 of FIG. 1.

Microchip 314 having exposed chip die 312 is attached to circuit board 310. First TIM 320 is applied to exposed chip die 312. Heatspreader 330 is secured against exposed chip die 312 using pins 331. Springs 332 are threaded onto pins 331 and provide a biasing force on heatspreader 330 against exposed chip die 312 once pins 331 are secured through circuit board mounting holes 313. Second TIM 340 is applied to the top face of heatspreader 330, and heat sink 350 is attached, contacting heatspreader 330 through second TIM 340.

In the exemplary embodiment of FIG. 3, heat sink 350 is shown as the outer wall of an enclosure. In this exemplary embodiment, chip die cooling assembly 300 acts as a completely passive cooling system. However, in alternative embodiments, fans may be used to circulate the air across the fins of heat sink 350. Additionally, in an alternative embodiment, air conditioning systems may be used to circulate cooled air across heat sink 350.

It should be appreciated by those skilled in the art that variations to the structure may be made to achieve the same functional results as the cooling components described. Mounting points, component shapes and sizes, and materials used may be altered to adapt the assembly to specific circumstances.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:
1. A microchip die cooling assembly comprising:
   a circuit board;
   a microchip having an exposed die attached to the circuit board;
   a heatspreader having a top side and a bottom side, the bottom side being positioned above the microchip;
   a heat sink having a bottom side and a top side comprising a cooling structure;
   a first thermal interface material in contact with the exposed die and the bottom side of the heatspreader;
   a second thermal interface material in contact with the top side of the heatspreader and the bottomside of the heat sink;
   a pin connected to the heatspreader and circuit board securing the heatspreader to the circuit board; and
   a spring connected to the pin to bias the heatspreader against the microchip.
2. The assembly of claim 1, wherein the assembly further comprises:
   two pins having barbs securing the heatspreader to the circuit board; and
   a spring attached to each pin that biases the heatspreader against the microchip.
3. The assembly of claim 1, wherein the heat sink is made of copper, zinc, aluminum, or a zamak alloy.
4. The assembly of claim 1, wherein the heat sink forms an outer wall of an enclosure which holds the circuit board.
5. The assembly of claim 1, wherein the heatspreader is made of copper or aluminum.
6. The assembly of claim 1, wherein the first thermal interface material is thermal grease or a phase change material.
7. The assembly of claim 1, wherein the second thermal interface material is a gap pad or thermal gel.
8. The assembly of claim 1, wherein the assembly is a passive cooling system.
9. A heatspreader for use in an assembly for cooling a microchip with an exposed chip die, comprising:
   a body that formed from a thermally conductive material;
   a planar bottom surface having an area significantly greater than the area of the exposed chip die for thermally connecting to the exposed chip die;
   a planar top surface having an area equal to the area of the planar bottom surface; and
   two mounting features extending outward from each other in opposition in a plane parallel to the bottom surface for mounting the heatspreader in a resiliently biased thermal connection with the exposed chip die, wherein the resilient biased thermal connection includes a pin extending between the heatspreader and a circuit board to bias the heatspreader.

10. The heatspreader of claim 9, wherein the thermally conductive material is one of copper or aluminum.

\* \* \* \* \*